United States Patent
Marciano et al.

(10) Patent No.: US 10,866,090 B2
(45) Date of Patent: Dec. 15, 2020

(54) ESTIMATING AMPLITUDE AND PHASE ASYMMETRY IN IMAGING TECHNOLOGY FOR ACHIEVING HIGH ACCURACY IN OVERLAY METROLOGY

(71) Applicant: KLA-TENCOR CORPORATION, Milpitas, CA (US)

(72) Inventors: Tal Marciano, Zychron Yaacov (IL); Nadav Gutman, Zichron Ya'aqov (IL); Yuri Paskover, Binyamina (IL); Guy Cohen, Yaafa (IL); Vladimir Levinski, Migdal HaEmek (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/075,811

(22) PCT Filed: Jul. 5, 2018

(86) PCT No.: PCT/US2018/040947
§ 371 (c)(1),
(2) Date: Aug. 6, 2018

(87) PCT Pub. No.: WO2019/010325
PCT Pub. Date: Jan. 10, 2019

(65) Prior Publication Data
US 2020/0132445 A1 Apr. 30, 2020

Related U.S. Application Data

(60) Provisional application No. 62/622,712, filed on Jan. 26, 2018, provisional application No. 62/529,107, filed on Jul. 6, 2017.

(51) Int. Cl.
*G01B 11/27* (2006.01)

(52) U.S. Cl.
CPC ................... *G01B 11/272* (2013.01)

(58) Field of Classification Search
CPC ............... G01B 11/272; G01B 11/27
(Continued)

(56) References Cited

U.S. PATENT DOCUMENTS 10,601,630 B1 * 3/2020 Dickerman ......... H04L 27/3809
2002/0033953 A1 * 3/2002 Hill ..................... B82Y 20/00
356/516

(Continued)

OTHER PUBLICATIONS

ISA/KR, ISR and WO for PCT/US2018/040947, Nov. 15, 2018.

*Primary Examiner* — Roy M Punnoose
(74) *Attorney, Agent, or Firm* — Hodgson Russ LLP

(57) ABSTRACT

Metrology methods are provided for deriving metrology measurement parameter value(s) by identifying the value(s) in which the corresponding metrology measurement signal(s) have minimal amplitude asymmetry. Selecting the measurement parameter values as disclosed reduces significantly the measurement inaccuracy. For example, wavelength values and/or focus values may be detected to indicate minimal amplitude asymmetry and/or minimal phase asymmetry. In certain embodiments, wavelength values which provide minimal amplitude asymmetry also provide minimal signal sensitivity to focus. Developed metrics may be further used to indicate process robustness across wafers and lots. In some embodiments, imaging accuracy may be enhanced by through-focus landscaping of the amplitude asymmetry and detection of parameters values with minimal amplitude asymmetry.

14 Claims, 3 Drawing Sheets

(58) Field of Classification Search
USPC .......................................................... 356/138
See application file for complete search history.

(56) References Cited

U.S. PATENT DOCUMENTS

| | | |
|---|---|---|
| 2015/0346605 A1* | 12/2015 | Den Boef ............. H01L 23/544 438/401 |
| 2016/0084758 A1 | 3/2016 | Manassen et al. |
| 2016/0161863 A1 | 6/2016 | Den Boef et al. |
| 2016/0179017 A1 | 6/2016 | Yohanan et al. |
| 2016/0313658 A1 | 10/2016 | Marciano et al. |

* cited by examiner

ESTIMATING AMPLITUDE AND PHASE ASYMMETRY IN IMAGING TECHNOLOGY FOR ACHIEVING HIGH ACCURACY IN OVERLAY METROLOGY

CROSS REFERENCE TO RELATED APPLICATIONS

This application claims the benefit of U.S. Provisional Patent Application No. 62/529,107 filed on Jul. 6, 2017, and further claims the benefit of U.S. Provisional Patent Application No. 62/622,712 filed on Jan. 26, 2018, which are incorporated herein by reference in their entirety.

BACKGROUND OF THE INVENTION

1. Technical Field

The present invention relates to the field of semiconductor metrology, and more particularly, to improving the accuracy of metrology imaging measurements.

2. Discussion of Related Art

As semiconductor node size shrinks, the accuracy requirements for metrology measurements increase and the effects of production asymmetries become ever more significant.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method comprising deriving a value of at least one metrology measurement parameter by identifying the value in which a corresponding metrology measurement signal has minimal amplitude asymmetry.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
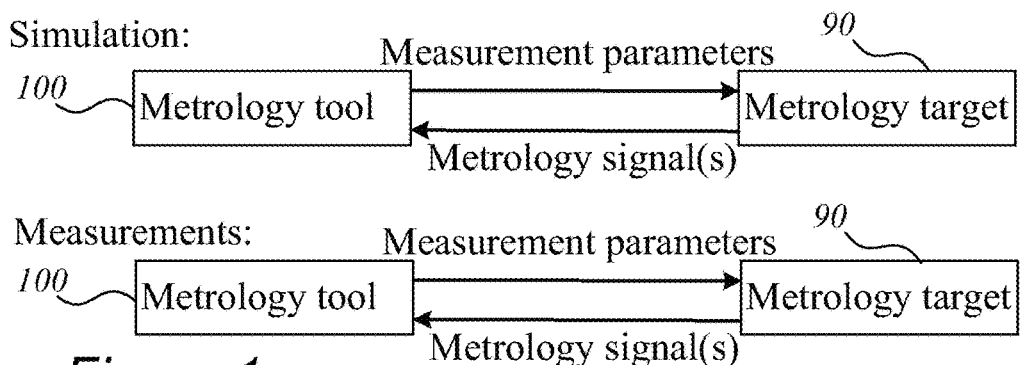
FIG. 1 is a high-level schematic block diagram of a metrology tool used for measuring a metrology target, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation in the visual range, ultraviolet or even shorter wave radiation such as x rays, and possibly even particle beams.

Embodiments of the present invention provide efficient and economical methods and mechanisms for enhancing metrology accuracy and thereby provide improvements to the technological field of semiconductor metrology. Certain embodiments provide ways to estimate the amplitude asymmetry in the signal leading to inaccuracy in the imaging technology and to determine the optimal measurement reducing the inaccuracy, possibly to 0 nm. Disclosed methods permit to improve the accuracy of the overlay measurement.

Metrology methods are provided, of deriving metrology measurement parameter value(s) by identifying the value(s) in which the corresponding metrology measurement signal(s) have minimal amplitude asymmetry. Selecting the measurement parameter values as disclosed reduces significantly the measurement inaccuracy. For example, wavelength values and/or focus values may be detected to indicate minimal amplitude asymmetry and/or minimal phase asymmetry. In certain embodiments, wavelength values which provide minimal amplitude asymmetry also provide minimal signal sensitivity to focus. Developed metrics may be further used to indicate process robustness across wafers and lots. In some embodiments, imaging accuracy may be enhanced by through-focus landscaping of the amplitude asymmetry and detection of parameters values with minimal amplitude asymmetry.

In certain embodiments, overlay imaging technology comprises of imaging AIM (advanced imaging metrology) targets (which comprise periodic patterns such as gratings in two or more layers, e.g., in a previous layer and a current layer) and extracting overlay value(s) which expresses misalignment among the periodic patterns (e.g., in nanometers). Asymmetries in the targets, e.g., due to printability errors, induce inaccuracy in the overlay measurement. Each of the target structures (e.g., in the current or previous layers) provides, upon measurement, a signal that is a product of the interferences between the different diffracted orders, the signal being expressed in Equation 1, with $I_{+/-1}$ denoting the intensity of the +1/−1 diffracted order of the signal S at coordinate x and corresponding angular coordinates $\pm\theta_0$, P denoting the periodicity of the grating structure (e.g., pattern pitch), A denoting the amplitude of the signal, $\varphi$ denoting the topographic phase, and $\delta\varphi$ and $\delta\alpha$ denoting the phase and amplitudes asymmetries, respectively, with $Z(\theta,\lambda,P)$ being an unknown function and $\Delta F$ denoting a dependency on the focus parameter.

$$S = I_1(x, -\theta_0) + I_{-1}(x, \theta_0) = \qquad \text{Equation 1}$$
$$A\sin\left[\frac{2\pi x}{P} + \delta\varphi - \frac{8a}{a}(\varphi + Z(\theta, \lambda, P)\Delta F\right]$$

In case of the target grating being perfectly symmetry, the signal may be expressed by $$S = A\sin\left(\frac{2\pi x}{P}\right),$$

without any amplitude or phase asymmetry in the signal and with full accuracy of the overlay measurement. Any minor asymmetry in the grating structure results in amplitude and phase asymmetry ($\delta\alpha$ and $\delta\varphi$) and therefore in inaccuracy. Commonly, the amplitude asymmetry $\delta\alpha$ is the major contributor to inaccuracy while the phase asymmetry $\delta\varphi$ is usually negligible. The inventors have noted that $\delta\alpha$ is strongly wavelength-dependent and for any stack of layers, there are wavelengths $\lambda$ within the spectrum for which the amplitude asymmetry is minimized and even cancelled. The inventors point out the coupling between the phase asymmetry $\delta\varphi$ and the defocus $\Delta F$ in Equation 1 so that cancellation of the amplitude asymmetry $\delta\alpha$ would result in cancellation of the focus dependency $\Delta F$. Therefore, measuring the overlay variation through different focus position indicated the phase asymmetry behavior. The inventors further note that in wavelengths $\delta_0$ in which the amplitude asymmetry is small or zero (e.g., $\delta A=0$), the inaccuracy (at $\lambda_0$) is also small or zero, and the overlay does not vary much with the focus position (the overlay variation is zero or close to zero). In certain embodiments, the overlay variation through focus may thus be used to evaluate the asymmetry strength of the signal, and may also be used for selecting the most accurate measurement recipe (e.g., the values of one or more measurement parameters of the recipe).

FIG. 1 is a high-level schematic block diagram of a metrology tool 100 used for measuring a metrology target 90, according to some embodiments of the invention. In either simulation or during actual measurements, measurement recipe(s) that indicate the values of multiple measurement parameters are applied by metrology tool 100 to derive metrology signal(s) from metrology target(s) 90. Metrology tool 100 may comprise metrology modules which use simulations or actual measurements to carry out the disclosed methods.

Figure 2:
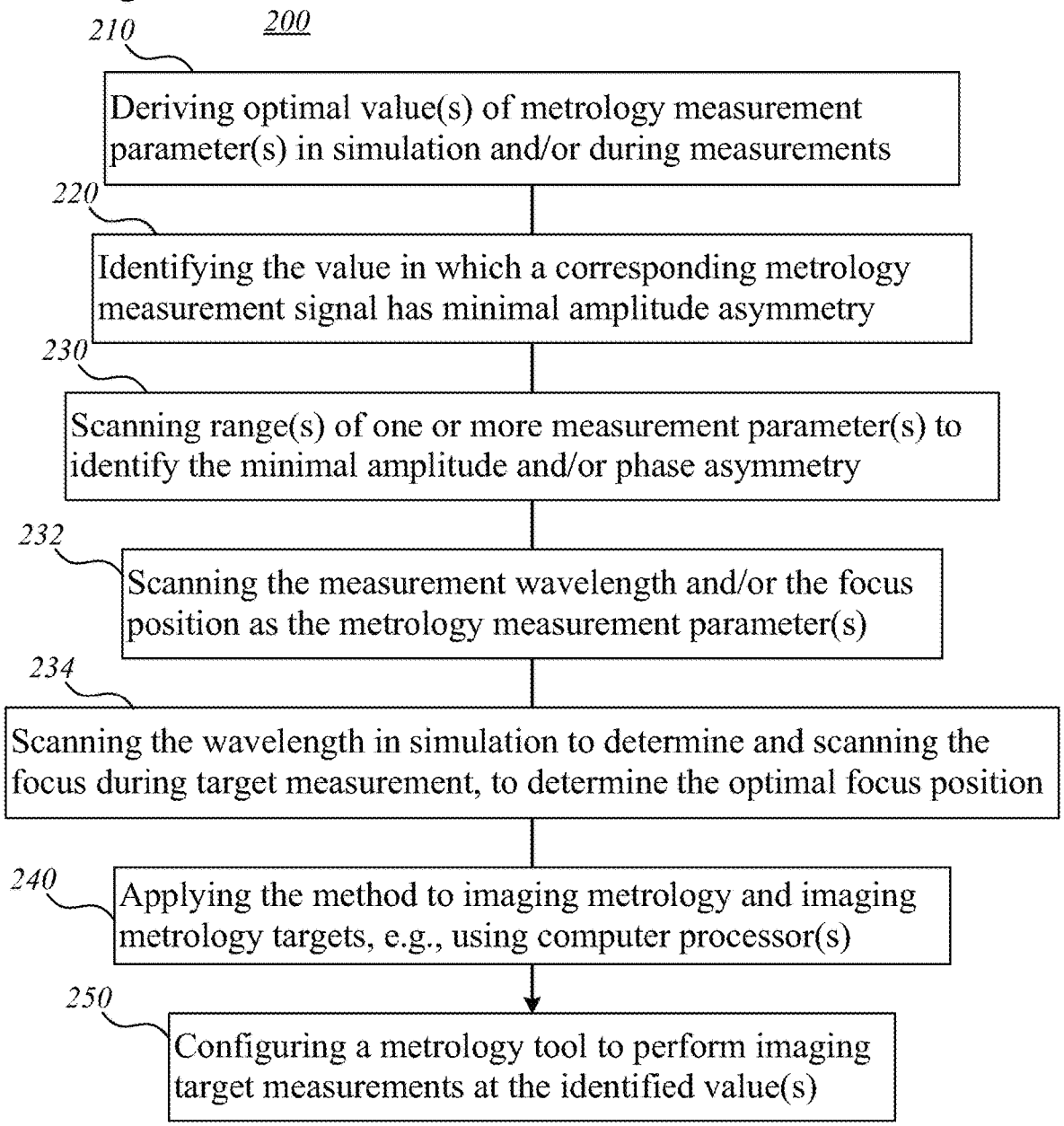
FIG. 2 is a high-level schematic flowchart illustrating a method, according to some embodiments of the invention.

FIG. 2 is a high-level schematic flowchart illustrating a method 200, according to some embodiments of the invention. The method stages may be carried out with respect to the metrology tool 100 or metrology module described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. Method 200 may comprise the following stages, irrespective of their order.

Method 200 may comprise deriving a value of at least one metrology measurement parameter (stage 210) by identifying the value in which a corresponding metrology measurement signal has minimal amplitude asymmetry (stage 220). For example, identifying 220 may be carried out by scanning at least one range of the least one measurement parameter (stage 230), e.g., scanning a measurement wavelength and/or a measurement focus position as the at least one metrology measurement parameter (stage 232) over specified uniform and/or disjunct ranges. In certain embodiments, method 200 may comprise scanning the measurement wavelength in simulation to determine a wavelength as a first parameter value, and the scanning the measurement focus during target measurement, to determine a focus position as a second parameter value (stage 234). Various embodiments of method 200 may be applied to imaging metrology and imaging metrology targets (stage 240).

In certain embodiments, method 200 may comprise identifying at least one measurement parameter value in which an amplitude asymmetry in a signal measured from an imaging target is minimized (stage 220), and configuring a metrology tool and/or metrology module to perform imaging target measurements at the at least one identified value (stage 250). Identifying 220 may be carried out with respect to a wavelength as the at least one measurement parameter, and method 200 may further comprise scanning a specified wavelength range to identify the value in which the amplitude asymmetry is minimized (stage 230). In certain embodiments, identifying 220 may be carried out with respect to a wavelength and a focus position as the at least one measurement parameter, with method 200 further comprising scanning specified wavelength and focus ranges to identify a focus position and a wavelength in which a corresponding grating position provides the minimal amplitude asymmetry at the identified wavelength (stage 232).

Certain embodiments comprise metrology module(s) configured to derive a value of at least one metrology measurement parameter by identifying the value in which a corresponding metrology measurement signal has minimal amplitude asymmetry. The identifying may be carried out by scanning at least one range of the least one measurement parameter. The scanning may comprise scanning a measurement wavelength and/or a measurement focus position as the at least one metrology measurement parameter. In certain embodiments, scanning the measurement wavelength may be carried out in simulation to determine a wavelength as a first parameter value, and the scanning of the measurement focus is carried out during target measurement, to determine a focus position as a second parameter value. Disclosed metrology modules and tools may be applied to imaging metrology and imaging metrology targets, and be part of corresponding metrology system(s). In certain embodiments, metrics such as the through-focus position variation of target structures may be further used to indicate the process robustness within wafer or between wafers or lots.

Figure 3:
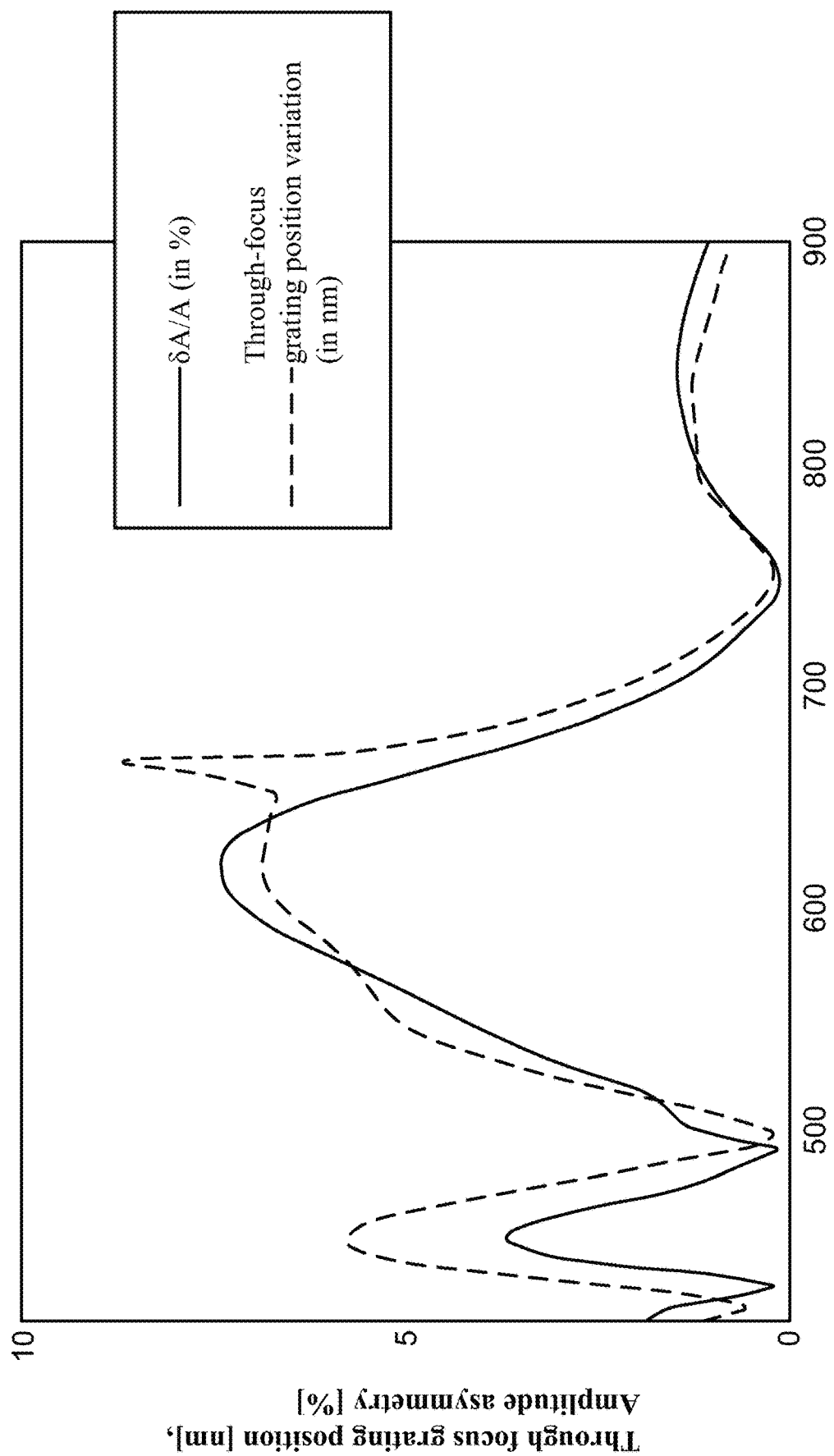
FIG. 3 provides a non-limiting example for the empirically established dependency of the amplitude asymmetry $\delta A/A$ and the through-focus grating position variation on the measurement wavelength in a RCWA (Rigorous Coupled Wave Analysis) simulation of realistic stack in presence of a simulated SWA (side wall angle) asymmetry in the grating structure, according to some embodiments of the invention.

FIG. 3 provides a non-limiting example for the empirically established dependency of the amplitude asymmetry $\delta A/A$ and the through-focus grating position variation on the measurement wavelength in a RCWA (Rigorous Coupled Wave Analysis) simulation of realistic stack in presence of a simulated SWA (side wall angle) asymmetry in the grating structure, according to some embodiments of the invention. As illustrated in FIG. 3, the through-focus grating position was found to be correlated with the amplitude asymmetry, and moreover to indicate wavelength values in which the amplitude asymmetry is minimal and close to zero, e.g., the amplitude asymmetry (and the through-focus grating position variation) almost disappears around 495 nm and around 750 nm—resulting in high accuracy of the overlay measurements. These values may be selected as the measurement parameter(s) (e.g., wavelength, and/or corresponding focus position) for following measurements. In certain embodiments, values with broader minima may be selected to provide measurements with more robust high accuracy with respect to deviations in the measurement parameter values.

Figure 4:
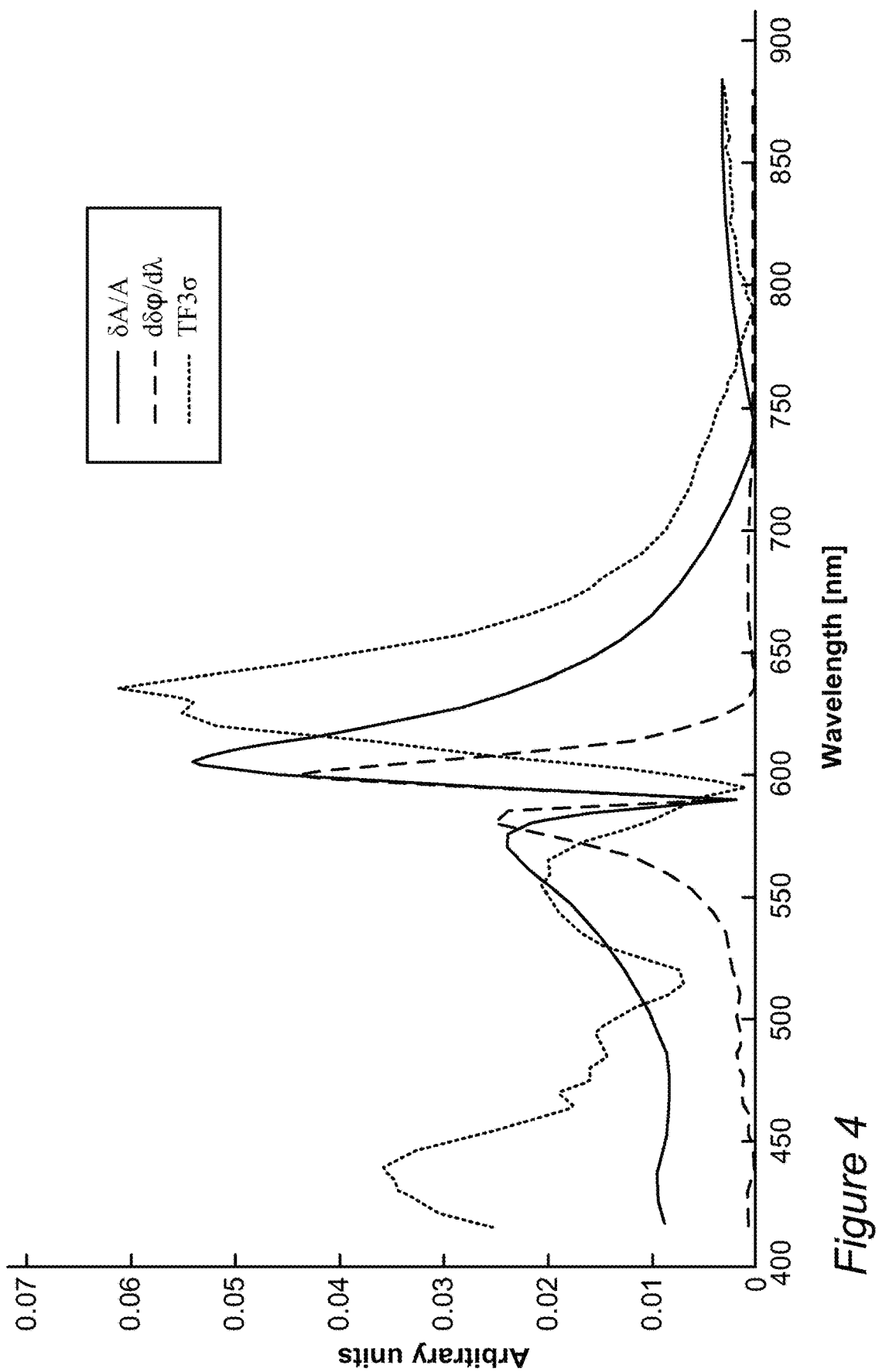
FIG. 4 provides a non-limiting example for the empirically established dependency of the amplitude asymmetry $\delta A/A$, the phase asymmetry $\delta \varphi$ (as $d\delta \varphi/d\lambda$) and TF3$\sigma$ on the measurement wavelength in a RCWA simulation of realistic stack in presence of a simulated SWA asymmetry in the grating structure, according to some embodiments of the invention.

FIG. 4 provides a non-limiting example for the empirically established dependency of the amplitude asymmetry $\delta A/A$, the phase asymmetry $\delta\varphi$ (as $d\delta\varphi/d\lambda$) and TF3$\sigma$ on the measurement wavelength in a RCWA simulation of realistic stack in presence of a simulated SWA asymmetry in the grating structure, according to some embodiments of the invention.

FIG. 4 illustrates again the existence of parameter values in which the amplitude asymmetry is minimized (e.g., ca. 590 nm and around 740 nm) and moreover shows that the phase asymmetry behaves similarly to the amplitude asymmetry, and therefore may be estimated as $$\frac{\partial \delta\varphi}{\partial \lambda} \sim \frac{\delta A}{A}.$$

Advantageously, disclosed methods provide new metrics that are highly correlated to the signal amplitude asymmetry and therefore to the inaccuracy of the measurement—and enable significant improvements to the measurement accuracy. In certain embodiments, the inventors have found that the through-focus variation of the grating position of each grating or the overlay are highly correlated to the amplitude asymmetry and therefore to the inaccuracy—and consequentially, associated metrics may be used for selecting the best accurate measurement conditions. Since these metrics scale with the degree of asymmetry, they may further be used as indicators of the process robustness within wafer or between wafers or lots. The actual metrology measurement may be carried out at wavelengths where the sensitivity to the asymmetry is high in order to map the process variations existing within fields, wafers, and lots. Moreover, target designs are proposed, for which the sensitivity to amplitude and phase asymmetry is minimized.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method for overlay metrology comprising:
   deriving, using a processor, a value of at least one metrology measurement parameter by identifying the value of the at least one metrology measurement parameter in which a corresponding metrology measurement signal has minimal amplitude asymmetry, wherein the identifying includes scanning at least one range of a measurement wavelength and/or a measurement focus position, wherein scanning the measurement wavelength is carried out in simulation to determine a wavelength as a first parameter value, and the scanning of the measurement focus is carried out during target measurement to determine a focus position as a second parameter value; and
   configuring a metrology tool to perform imaging target measurements at the at least one measurement parameter value.

2. The method of claim 1, applied to imaging metrology and imaging metrology targets.

3. A computer program product comprising a non-transitory computer readable storage medium having computer readable program embodied therewith, the computer readable program configured to carry out the method of claim 1.

4. The method of claim 1, wherein the identifying is carried out with respect to the measurement wavelength.

5. The method of claim 1, wherein the identifying is carried out with respect to the measurement focus position.

6. The method of claim 1, wherein the identifying is carried out with respect to the measurement wavelength and the measurement focus position.

7. A method for overlay metrology comprising:
   identifying, using a processor, at least one measurement parameter value in which an amplitude asymmetry in a signal measured from an imaging target is minimized thereby generating at least one identified value, wherein the identifying includes scanning at least one range of a measurement wavelength and/or a measurement focus position, wherein scanning the measurement wavelength is carried out in simulation to determine a wavelength as a first parameter value, and the scanning of the measurement focus is carried out during target measurement to determine a focus position as a second parameter value, and
   configuring a metrology tool to perform imaging target measurements at the at least one measurement parameter value.

8. The method of claim 7, wherein the identifying is carried out with respect to the wavelength as the at least one measurement parameter, further comprising scanning a specified wavelength range to identify the identified value in which the amplitude asymmetry is minimized.

9. The method of claim 7, wherein the identifying is carried out with respect to the wavelength and the focus position as the at least one measurement parameter, further comprising scanning specified wavelength and focus ranges to identify the focus position and the wavelength in which a corresponding grating position provides the amplitude asymmetry at the wavelength that is minimized.

10. A system for overlay metrology comprising:
    a metrology module that includes a processor, wherein the metrology module is configured to derive a value of at least one metrology measurement parameter by identifying the value of the at least one metrology measurement parameter in which a corresponding metrology measurement signal has minimal amplitude asymmetry, wherein the identifying includes scanning at least one range of a measurement wavelength and/or a measurement focus position, wherein scanning the measurement wavelength is carried out in simulation to determine a wavelength as a first parameter value, and the scanning of the measurement focus is carried out during target measurement to determine a focus position as a second parameter value; and
    a metrology system that includes the metrology module, wherein the metrology system is configured to image a metrology target.

11. The system of claim 10, wherein the metrology module is applied to imaging metrology and imaging metrology targets.

12. The system of claim 10, wherein the identifying is carried out with respect to the measurement wavelength.

13. The system of claim 10, wherein the identifying is carried out with respect to the measurement focus position.

14. The system of claim 10, wherein the identifying is carried out with respect to the measurement wavelength and the measurement focus position.

* * * * *